(12) United States Patent
Nishi et al.

(10) Patent No.: US 8,021,062 B2
(45) Date of Patent: Sep. 20, 2011

(54) DEVELOPING APPARATUS AND DEVELOPING METHOD

(75) Inventors: Takanori Nishi, Koshi (JP); Takahiro Kitano, Koshi (JP); Katsuya Okumura, Tokyo (JP)

(73) Assignees: Tokyo Electron Limited, Tokyo (JP); Octec Inc., Tokyo (JP)

( * ) Notice: Subject to any disclaimer, the term of this patent is extended or adjusted under 35 U.S.C. 154(b) by 0 days.

(21) Appl. No.: 12/774,006

(22) Filed: May 5, 2010

(65) Prior Publication Data

US 2010/0216077 A1    Aug. 26, 2010

Related U.S. Application Data

(62) Division of application No. 11/631,514, filed as application No. PCT/JP2005/012957 on Jul. 13, 2005, now Pat. No. 7,740,410.

(30) Foreign Application Priority Data

Jul. 15, 2004 (JP) ................................. 2004-208506

(51) Int. Cl.
G03B 13/00 (2006.01)
G03B 5/00 (2006.01)

(52) U.S. Cl. ........................................ 396/611; 396/571

(58) Field of Classification Search ................... 396/564, 396/571, 575, 604, 611
See application file for complete search history.

(56) References Cited

U.S. PATENT DOCUMENTS

| | | | |
|---|---|---|---|
| 6,837,631 B2 * | 1/2005 | Nakano et al. | 396/611 |
| 7,230,204 B2 | 6/2007 | Mitrovic et al. | |
| 2002/0081118 A1 | 6/2002 | Sakurai et al. | |
| 2003/0068579 A1 | 4/2003 | Takahashi et al. | |
| 2003/0224104 A1 | 12/2003 | Fukunaga et al. | |
| 2005/0058944 A1 | 3/2005 | Takahashi et al. | |
| 2007/0275178 A1 * | 11/2007 | Nishi et al. | 427/430.1 |

FOREIGN PATENT DOCUMENTS

| | | |
|---|---|---|
| JP | 6-333809 | 12/1994 |
| JP | 10-270307 | 10/1998 |
| JP | 11-40470 | 2/1999 |
| JP | 2000-124120 | 4/2000 |
| JP | 2000-298356 | 10/2000 |
| JP | 2002-252167 | 9/2002 |
| JP | 2002-343698 | 11/2002 |

OTHER PUBLICATIONS

Japanese Office Action issued on Sep. 15, 2009 for Japanese Application No. 2003-332482 w/ English translation.
Notification of Transmittal of Translation of the International Preliminary Report on Patentability (Form PCT/IB/338), in connection with PCT/JP2004/013922, dated Jan. 2004.
Translation of International Preliminary Report on Patentability (Form PCT/IPEA/409), in connection with PCT/JP2004/013922, dated Jan. 2004.
Japanese Office Action issued on Feb. 3, 2009 for Japanese Patent Application No. 2004-208506 with English translation.

* cited by examiner

*Primary Examiner* — Rodney E Fuller
(74) *Attorney, Agent, or Firm* — Smith, Gambrell & Russell, LLP

(57) ABSTRACT

A developing apparatus has a substrate holder to hold a substrate, a heater which is provided in a substrate holder, and heats a substrate on a substrate holder for processing a resist film by PEB, a cooler to cool a substrate on a substrate holder, a developing solution nozzle to supply a developing solution to a substrate on a substrate holder, and a controller to control a heater, a cooler and a developing nozzle.

3 Claims, 14 Drawing Sheets

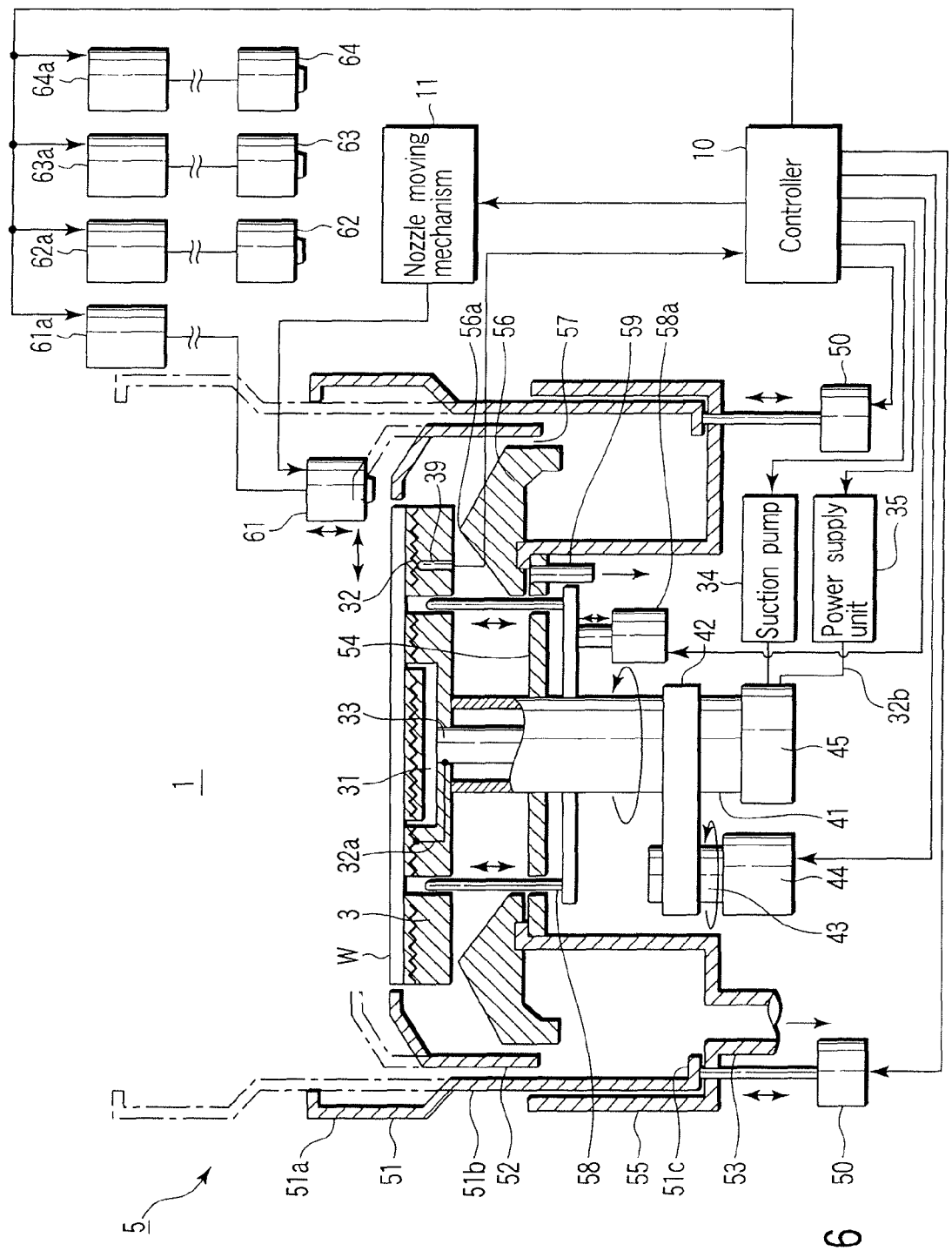
F I G. 6

DEVELOPING APPARATUS AND DEVELOPING METHOD

CROSS REFERENCE TO RELATED APPLICATION

This application is a division of Ser. No. 11/631,514, filed Jan. 4, 2007, now U.S. Pat. No. 7,740,410, issued on Jun. 22, 2010, which is a 371 National Phase entry of PCT/JP2005/012957, filed Jul. 13, 2005 and claims the benefit of JP 2004-208506, filed Jul. 15, 2004, all of which are being incorporated in their entirety herein by reference.

TECHNICAL FIELD

The present invention relates to a developing apparatus and method for developing a pattern exposed resist-coated film, and in particular to a developing apparatus and method applicable to electron beam writing exposure.

BACKGROUND ART

A photolithography process of semiconductor device uses a system incorporating a coating-developing apparatus in an exposure apparatus. As an exposure apparatus, a stepper (reduction projection step and repeat exposure system) using KrF excimer laser as a light source is generally used. A stepper applies light to a resist film through a photo mask (reticle), and transfers a predetermined circuit pattern to a resist film. However, in the recent semiconductor device manufacturing, many different types of products are manufactured, and a photo mask must to be made for each type of product in an exposure apparatus, increasing the manufacturing cost. Therefore, electron beam writing exposure requiring no photo mask has received attention.

Electron beam writing exposure is a technique of writing a predetermined pattern by applying an electron beam directly to a resist film. For example, as shown in FIG. 1, an electron beam emitted from an electron gun 111 is bent by an electric field formed by electromagnetic lenses 112 and 113 corresponding to a mask, and a predetermined mark pattern is formed by combination of electromagnetic lenses 112 and 113, and directly written on a resist film 114.

In electron beam writing exposure, an electron beam is easier to be bent if its energy is smaller, and an electron beam with a low acceleration is used. Thus, energy of an electron beam per unit time given to the resist film 114 is small, and if an electro beam is emitted for a short time, the resist film 114 is insufficiently exposed. Particularly, when a chemically amplified resist is exposed by electron beam writing exposure, the amount of exposure is extremely insufficient. If the electron beam emitting time is set long (e.g. about 20 minutes) as a measure to prevent insufficient exposure, a throughput will be lowered.

FIGS. 2A and 2B are schematic illustrations showing exposing and developing states by using a positive chemically amplified resist. First, expose a film coated with the resist 114 on a wafer W. A proton ($H^+$) 116 is generated in an exposure area 115 (shown shaded) as shown in FIG. 2A. Then, heat the wafer W to a temperature of 90-140° C. in a PEB (Post Exposure Bake) process, the proton ($H^+$) diffuses in the resist 114, and accelerates acid catalysis. The proton ($H^+$) resolves a base resin of the resist 114, and the resist 114 becomes soluble in a developing solution. During the acid catalysis, a new proton ($H^+$) is generated like a chain reaction, and the new proton ($H^+$) resolves the base resin. In this way the acid catalysis is amplified and accelerated one after another. Then, pour a developing solution on the resist R coated film. An exposed portion 115 is dissolved, and a resist pattern 115a is formed.

However, in electron beam writing exposure, the exposing amount is insufficient and the exposed portion 115 is difficult to be dissolved in the developing solution, and as shown in FIG. 2B, the resist pattern 115a may become unclear. As a result, it is impossible to form a well-shaped resist pattern with precise line width.

As described above, in electron beam writing exposure, the effective sensitivity of a chemically amplified resist is low and the exposure time is long, and the throughput is extremely lower than exposure by a stepper (reduction projection step and repeat exposure system) using KrF excimer laser ($\lambda=248$ nm) or ArF excimer laser ($\lambda=193$ nm).

DISCLOSURE OF INVENTION

It is an object of the invention to provide a developing apparatus and method, which provide a well-shaped resist pattern while preventing a decrease in a throughput, by sufficiently accelerating acid catalysis even if the energy of electron beam given to a resist film during exposure, by supplementing the insufficiency of energy during the processing.

It is an object of the invention to provide a developing apparatus, which does not need an exclusive heating unit for FEB processing, and decreases the footprint of the apparatus.

The inventor considers a method of forming a well-shaped resist pattern while preventing a decrease in a throughput, when a chemically amplified resist is used, by performing electron beam writing exposure in a short time by using a low-acceleration electron beam, and accelerating acid catalysis sufficiently by giving new energy to a resist film in a later PEB process.

Japanese Patent No. 3453073 (paragraphs 0021-0022) describes a developing apparatus having a heating means. However, in this conventional apparatus, a substrate holder is cooled or heated to prevent a temperature change in a wafer caused by an reaction of a resist film and a developing solution during a developing process. This temperature change in the wafer is 10-30° C., and does not accelerate acid catalysis in a chemically amplified resist.

Therefore, the inventor completes the invention described hereinafter to solve a low throughput in electron beam writing exposure and a low effective sensitivity of a chemically amplified resist.

According to the invention, there is provided a developing apparatus which develops a resist film on a substrate after exposure, comprising (i) a substrate holder to hold the substrate, (ii) a heating means which is provided in the substrate holder, and heats the substrate on the substrate holder to a predetermined temperature for processing the resist film by PEB, (iii) a cooling means for cooling a substrate heated by the heating means on the substrate holder, (iv) a developing solution supply means for supplying a developing solution to a substrate cooled by the cooling means on the substrate holder, and (v) a control means for controlling the heating means, the cooling means and the developing solution supply means.

Here, a resist liquid is a chemically amplified type, and it is desirable to provide a surface reforming liquid supply means for supplying a substrate with a surface reforming liquid to accelerate acid catalysis while heating a resist film. It is also permitted to provide a removing agent supply means for supplying a removing agent to the substrate to remove a surface reforming liquid from the substrate.

A cooling means may be a rotation mechanism for rotating the substrate holder to radiate a substrate, or a Peltier element provided in the substrate holder. Further, it is also permitted to provide a suction means for removing by absorbing liquid from a substrate. Exposure is for writing a predetermined mask pattern by emitting an electron beam to the surface of a substrate coated with a chemically amplified resist film.

According to the invention, there is provided a developing method which develops a resist film on a substrate after exposure, comprising (a) placing a substrate having an exposed resist film on a substrate holder, (b) heating a substrate to a predetermined temperature on the substrate holder for processing the resist film by PEB, (c) cooling a substrate on the substrate holder to a temperature capable of developing the resist film, and (d) developing the resist film by supplying a developing solution to a substrate on the substrate holder.

According to the invention, not only development but also heating by PEB can be performed in a developing apparatus. Therefore, an exclusive PEB unit is unnecessary, the total number of units of a whole coating-developing apparatus is decreased, the apparatus can be made compact, and the carrying efficiency of the apparatus can be increased. As an exposed resist film is heated in the developing apparatus, the footprint of the apparatus can be reduced by the dimensions of the heating unit for PEB performing the thermal treatment. When a chemically amplified resist liquid is used, by heating an exposed resist film in the state that a surface reforming liquid exists on the surface of a substrate, even if energy given to a resist film during exposure is insufficient, the insufficiency of energy is supplemented during the heating process, acid catalysis is sufficiently accelerated, and a well-shaped resist pattern can be obtained while preventing a decrease in a throughput, as a result.

A surface reforming liquid is preferably glycerin ($C_3H_8O_3$), or a liquid containing glycerin. A surface reforming liquid may be a mist or vapor containing glycerin. The inventor assumes that water ($H_2O$) contained in glycerin acts on a resist component, and accelerates acid catalysis in a resist during PEB. Glycerin is very excellent in hygroscopicity and moisture retention, infiltrates water ($H_2O$) into a resist, and increases activity of proton ($H^+$) in the resist. As a result, acid catalysis in a resist is accelerated. To produce a mist or vapor containing glycerin, pour glycerin into a vaporizer together with a solvent (e.g. water), and spray a mist-like glycerin mixture from the vaporizer.

The surface reforming liquid may be a gel or solution including a hydro-gel resin, such as polyacrylic acid chloride, polysulfonic acid salt, quaternary ammonium salt, polyethylene imine, polyvinyl alcohol, polyacrylamide, polyethylene glycol, polyglutamic acid, and polyaspartic acid.

BRIEF DESCRIPTION OF DRAWINGS

FIG. 6 is a sectional block diagram showing a developing apparatus according to a first embodiment of the invention;

BEST MODE FOR CARRYING OUT THE INVENTION

Hereinafter, explanation will be given on best mode for embodying the invention with reference to the accompanying drawings.

Figure 1:
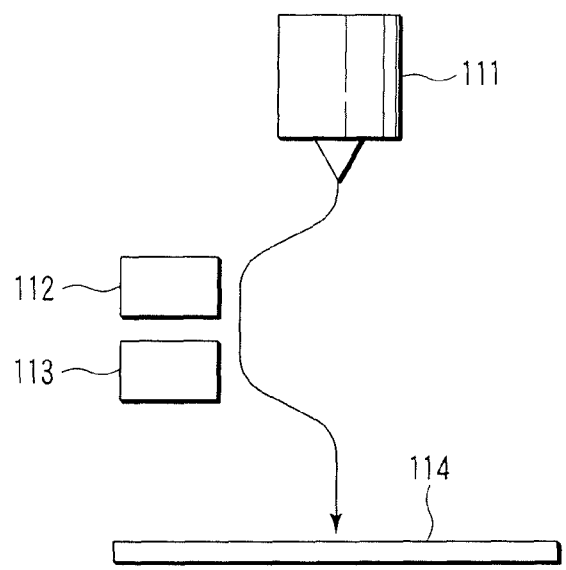
FIG. 1 is a schematic diagram showing exposure by an electron beam exposing apparatus.
Figure 2A:
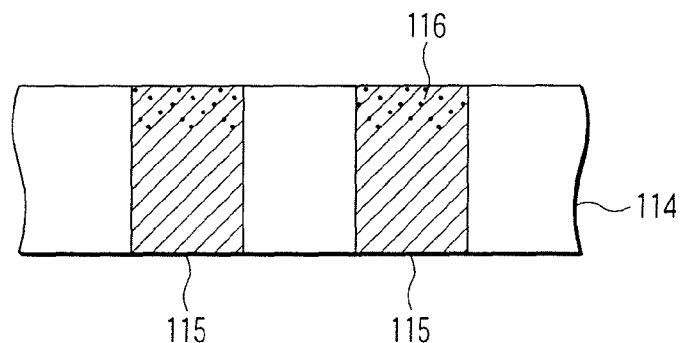
FIG. 2A is an enlarged sectional view of a resist pattern formed by using a conventional apparatus.
Figure 2B:
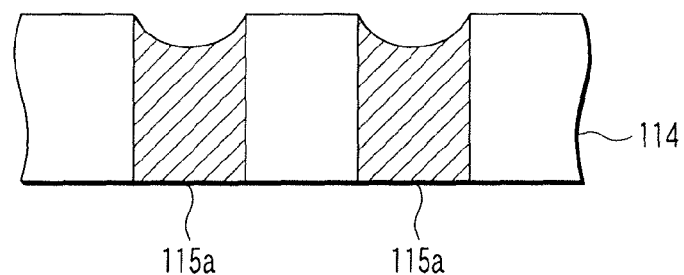
FIG. 2B is an enlarged sectional view of a resist pattern formed by using a conventional apparatus.
Figure 3:
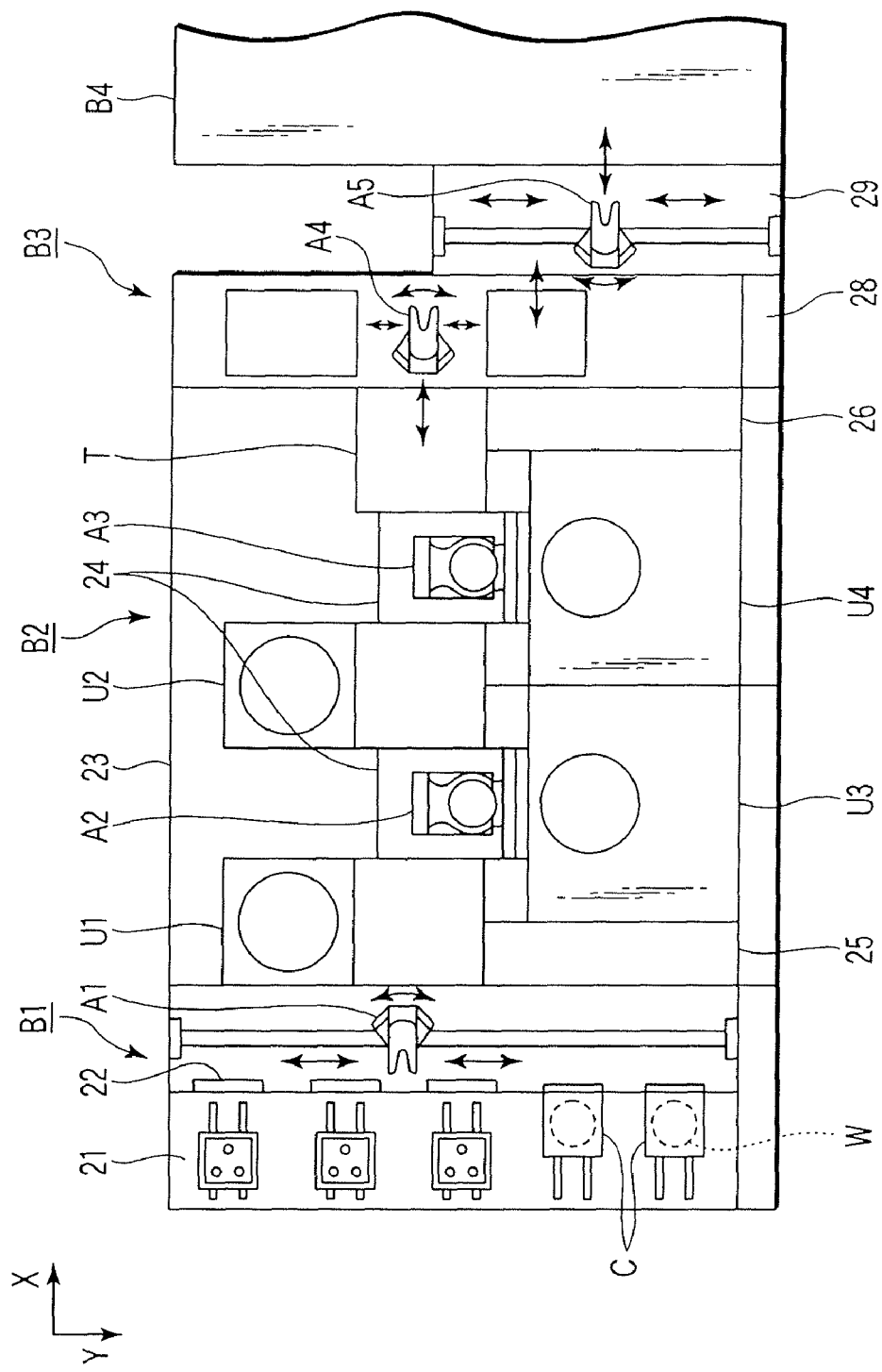
FIG. 3 is a top plan view of a coating-developing apparatus.
Figure 4:
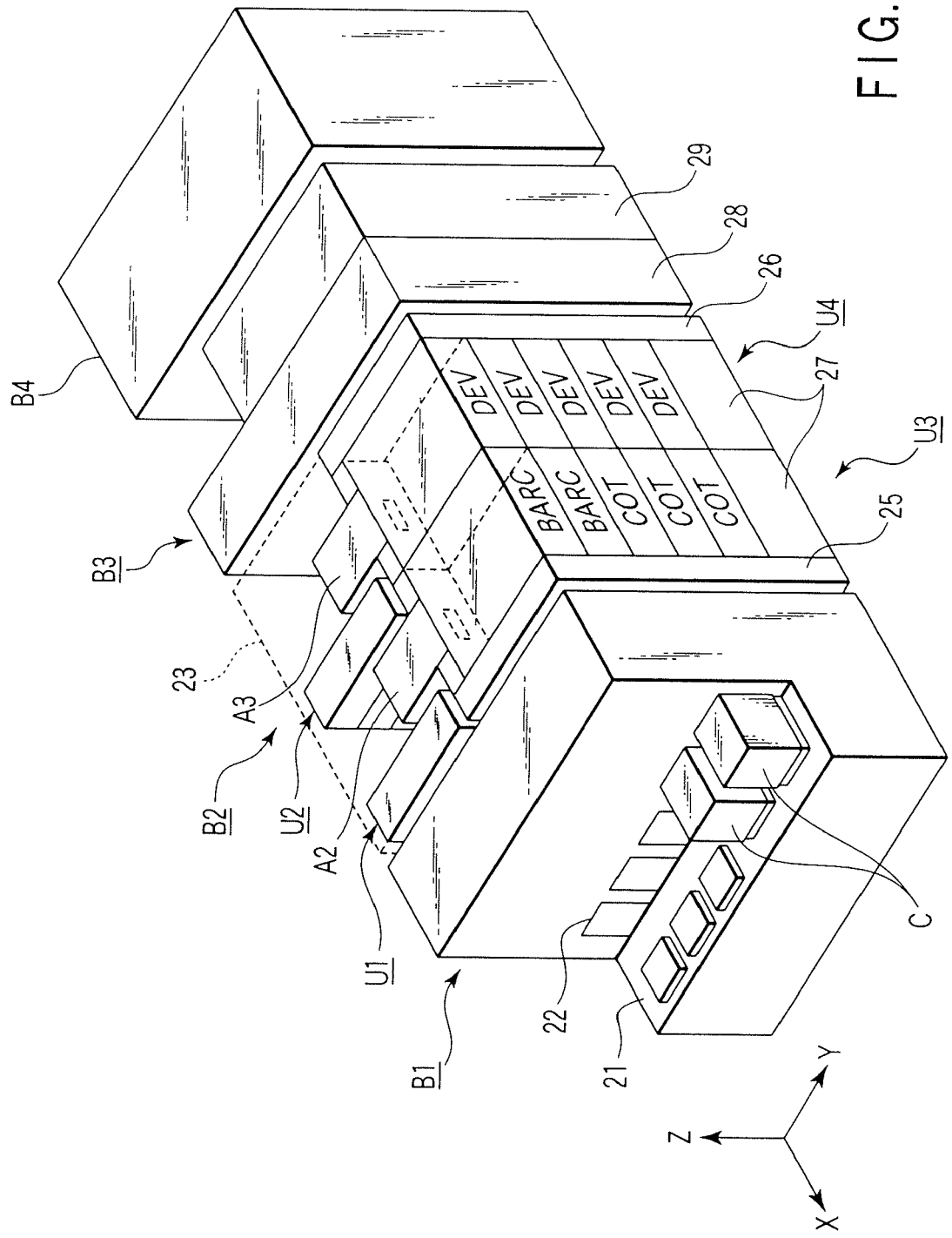
FIG. 4 is a perspective view of a coating-developing apparatus.

As shown in FIG. 3 and FIG. 4, a coating-developing apparatus has a carrier mounting block B1, a processing block B2 and an interface block B3 arranged in the X direction, and is connected to an exposure unit block B4 through the interface block B3. A wafer W is transferred and carried between the coating-developing apparatus and exposure unit B4, through auxiliary transfer means A4 and A5 of the interface block B3.

The carrier mounting block B1 has a mounting table 21, an open/close part 22, and a transfer arm A1. On the mounting table 21, a plurality of carrier C is mounted. The carrier C tightly contains 13 wafers W, for example. The open/close part 22 is provided on the rear sidewall of the mounting table 21. A not-shown shutter is provided in the opening of the open/close part 22. A covered carrier C is to be connected to the opening of the open/close part 22. After the cover is removed, the transfer arm A1 takes out the wafer W from the carrier C.

The processing block B2 is connected to the rear of the carrier mounting block B1. The processing block B2 is surrounded by a cabinet 23, and provided with two shelf units U1 and U2 and two main transfer mechanisms A2 and A3 arranged sequentially from the upstream side to downstream side in the X direction. The shelf units U1 and U2 are formed by stacking a plurality of heating/cooling unit vertically in multiple stages. The main transfer mechanisms A2 and A3 have an arm holder to transfer the wafer W to other elements, and has X/Y/Z driving mechanisms and θ rotation mechanism for driving the arm holder in each direction. The arm holder holds the wafer W at several points of the peripheral edge on the backside of the wafer W.

A transfer unit T is provided at the rear of the main transfer mechanism A3. The transfer unit T is used to transfer the wafer W between the processing section B2 and interface section B3.

The shelf units U1/U2, main transfer mechanisms A2/A3, and transfer unit T are connected in a line when viewed from the carrier mounting block B1. A not-shown opening for carrying a wafer is formed at each part of the connection. The wafer W is transferred by the main transfer mechanisms A2 and A3, from the shelf unit U1 to the transfer unit T, through these openings.

The main carry means A2 and A3 are placed in a space surrounded by one side of the shelf units U1/U2 and transfer unit T aligned when viewed from the carrier mounting block B1, one side of the liquid processing units U4 and U5 arranged on the right side, and a partition wall 24 formed by the rear side that forms the left side of the space. Reference numerals 25 and 26 in the drawing denote a temperature adjustment unit used in each module or a temperature/humidity adjustment unit having a duct for adjusting temperature and humidity.

In the liquid processing units U3 and U4, a plurality of coating unit (BARC), a resist liquid coating unit (COT), and a developing unit (DEV) are stacked in multiple stages (e.g. 5 stages) on a housing 27, as shown in FIG. 4. The housing 27 has sources for supplying a chemical solution for antireflection film, a resist liquid and a developing solution. To simplify terms, the antireflection film coating unit is called an antireflection film unit, and a resist liquid coating unit is called a coating unit.

Figure 5:
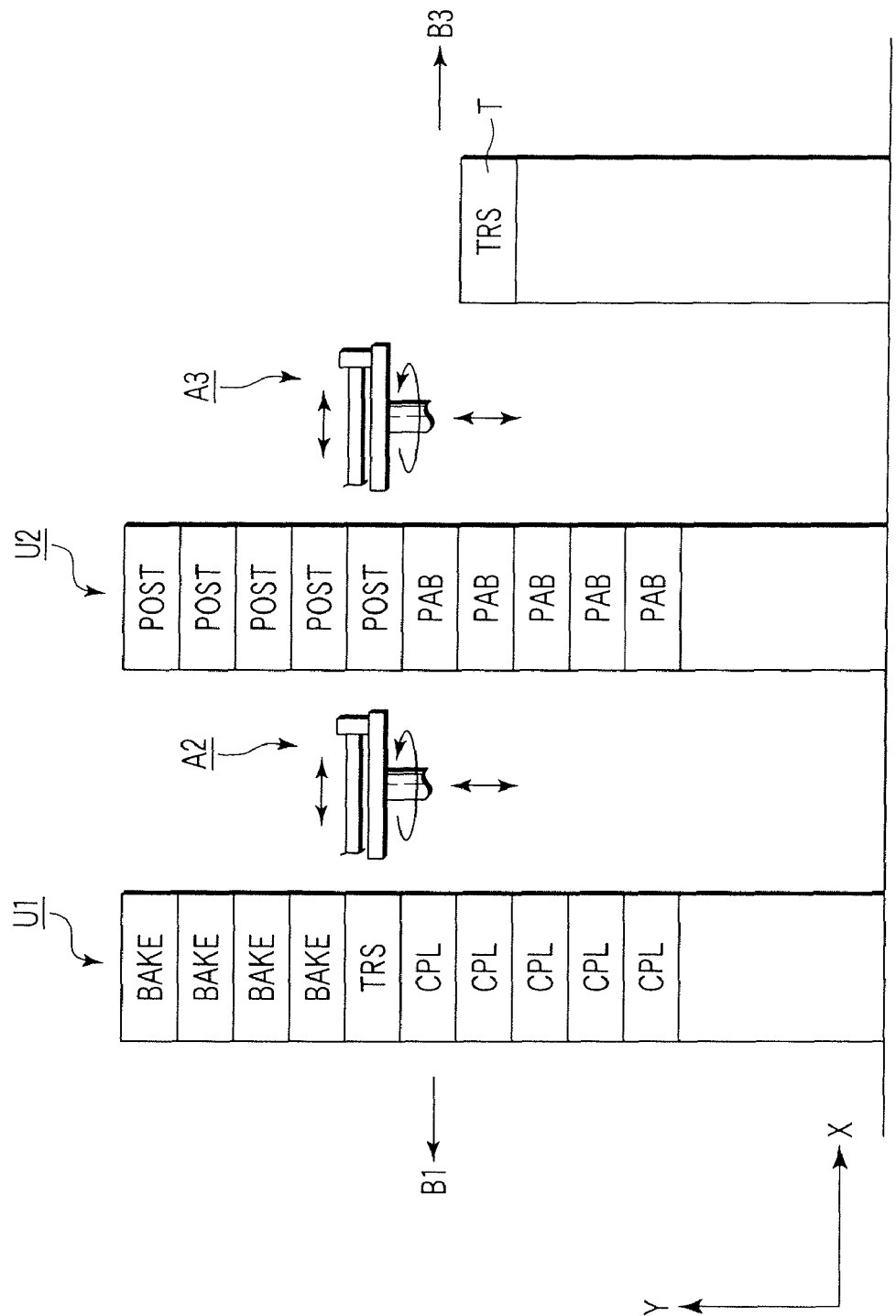
FIG. 5 is a perspective of a shelf unit of a coating-developing apparatus, viewed from the side.

The shelf units U1 and U2 include a plurality of heat processing units stacked vertically in multiple stages. These units include a transfer unit (TRS), a temperature adjustment unit (CPL), a baking unit (BAKE), a pre-baking unit (PAB), and a post-baking unit (POST), as shown in FIG. 5. The baking unit (BAKE) heats the wafer W before coating a resist liquid. The pre-baking unit (PAB) heats the wafer W in a period after coating the resist liquid and before exposure. The post-backing unit (POST) heats the wafer W in a period after exposure and before development. The unit layout shown in FIG. 5 is just an example, and in an actual apparatus, the number of units to provide is determined by considering the processing time of each unit.

At the rear of the transfer unit T of the processing block B2, an electron beam exposure unit B4 is connected through the interface section B3. The interface block B3 has a first transfer chamber 28 and a second transfer chamber 29 arranged between the processing block B2 and exposure unit B4. In the first and second transfer chambers 28 and 29, the main transfer means A4 and auxiliary transfer means A5 are provided as a second transfer means.

The electron beam exposure unit B4 applies a low-energy electron beam to a resist film, and writes a predetermined pattern directly on the resist film. A low-energy electron beam mentioned here means an electron beam with acceleration of 5 kV or lower.

In such apparatus, the wafer W before processing placed on the carrier mounting block B1 is transferred to the transfer unit (TRS) by the transfer arm A1, and then transferred sequentially to the temperature adjustment unit (CPL), the antireflection film forming unit (BARC), the heating unit (BAKE), the temperature adjustment unit (CPL), and the coating unit (COT) by the main transfer mechanisms A2 and A3. The wafer W is coated with a chemically amplified resist liquid in this unit (COT). Then, the wafer W is sent to the exposure unit B4 through the heating unit (PAB), the temperature adjustment unit (CPL), the transfer unit T, and the interface block B3. In the exposure unit B4A, a predetermined pattern is written on the resist film by an electron beam.

After being exposed, the wafer W is returned to the processing block B2 in the reverse route, and transferred to the developing unit (DEV), where the wafer W is subjected to a heating process called a PEB process after exposure and a developing process, as described later. Then, the wafer W is transferred sequentially to the heating unit (POST), the temperature adjustment unit (CPL), and the transfer unit (TRS) of the shelf unit U1, and returned to the carrier C on the carrier mounting block B1 by the transfer arm A1.

Embodiment 1

Figure 7:
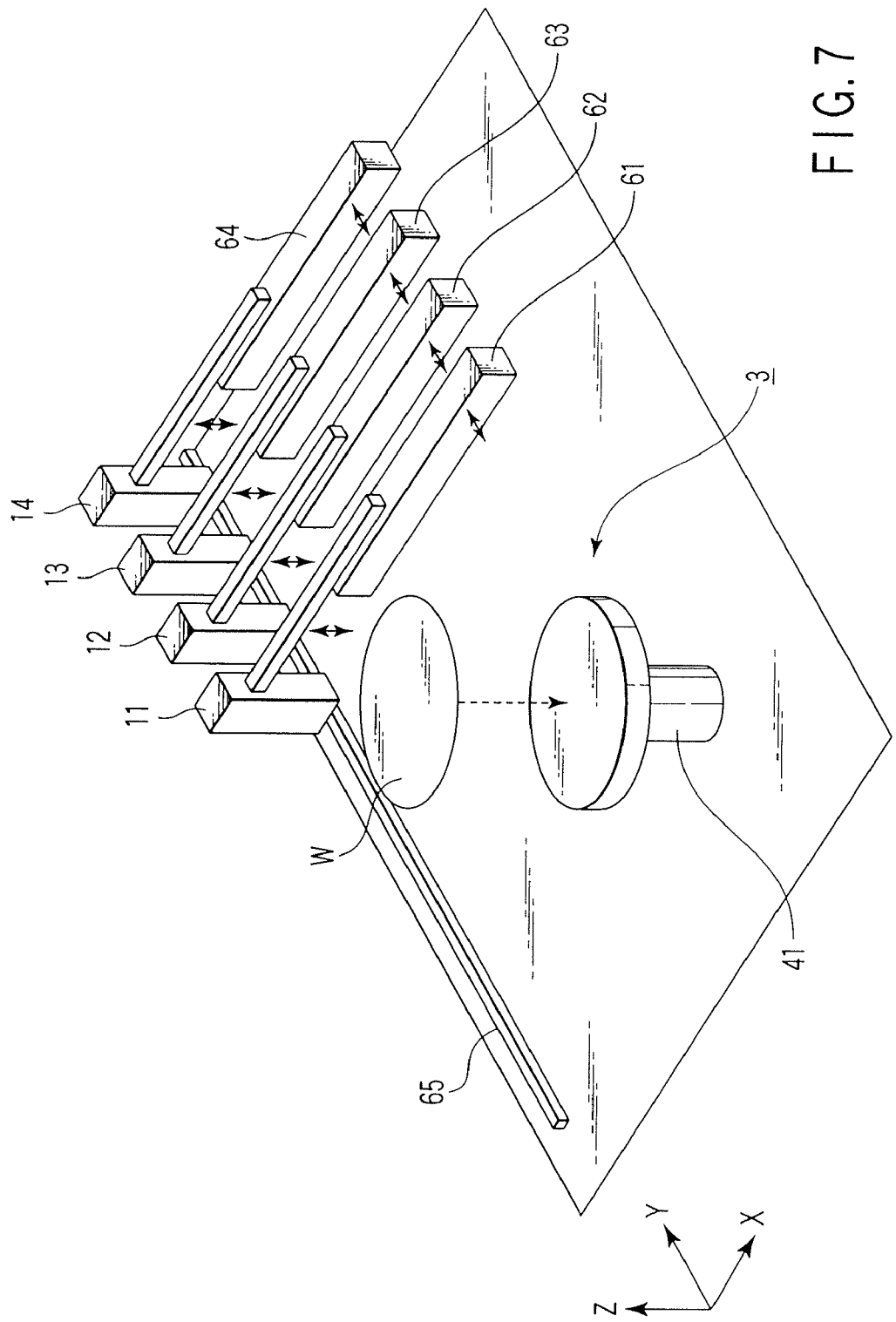
FIG. 7 is a diagrammatic sketch of a developing apparatus.

An explanation will be given on a developing unit (DEV) as a developing apparatus according to a first embodiment of the invention with reference to FIG. 6-FIG. 8.

A developing unit (DEV) 1 performs a heating process (PEB process) before development and a developing process. When a resist is exposed by light with a single wavelength, an incident light to a resist film interferes with a reflected light from a wafer, and a standing wave is generated. This causes a change in the thickness of a resist film, and the line width is fluctuated. The PEB process mentioned here means thermal treatment to decrease the influences of the change in the film thickness and fluctuation of line width, that is, to decrease a distortion of a resist pattern (a resist sidewall shape), or thermal treatment to cause acid catalysis in a resist film in the case of using a chemically amplified resist liquid.

The developing unit (DEV) 1 has a substrate holder 3, a cup 5, four liquid supply nozzles 61, 62, 63 and 64, four liquid supply sources 61a, 62a, 63a and 64a, nozzle moving mechanisms 11, 12, 13 and 14, a heater 32, a suction pump 34, a power supply unit 35, a rotation drive 44, a cup up-and-down mechanism 50, a temperature sensor 39, and a controller 10. The developing unit (DEV) 1 is also provided with not-shown sensors and detectors in addition to the temperature sensor 39. These sensors are connected to the input section of the controller 10, and send detected signals of temperature, flow rate, pressure, density, current, voltage, position, time, speed, and acceleration to the controller 10. Based on these input signals, the controller 10 collectively controls the auxiliary components of the developing unit (DEV) 1.

The substrate holder 3 is a spin chuck to hold the wafer W horizontally and rotatably. The substrate mounting surface of the spin chuck 3 is shaped like a disc, and made of material with excellent thermal conductivity, for example, AlN (aluminum nitride) and SiC (silicon carbide). The spin chuck 3 has a suction part 31 and a heater 32. The passage of the suction part 31 is connected to the suction port of the suction pump 34, and opened in the substrate mounting surface (upper surface) of the spin chuck 3. The heater 32 is made of a resistance heating wire connected to the power supply unit 35, and buried in the substrate mounting member of the spin chuck 3. The heater 32 heats the wafer W to a predetermined temperature (e.g. 100-140° C.) for processing the exposed resist film by PEB.

The spin chuck 3 is supported by a rotation shaft 41. The rotation shaft 41 is connected to a driving rotation shaft 43 through a belt 42. When the driving rotation shaft 43 is rotated by the rotation drive 44, a rotating force is transmitted to the rotation shaft 41 through the belt 42.

A reference numeral 45 in the drawing denotes a bearing of the rotation shaft 41. The rotation shaft 41, belt 42, driving rotation shaft 43 and rotation drive 44 correspond to a rotation mechanism for rotating the spin chuck 3. The rotation mechanism 41-44 functions as a cooling means for cooling the wafer W.

The rotation shaft 41 is a hollow body. A suction passage 33 is provided in the hollow part of the rotation shaft 41. The inner wall of the suction passage 33 is made of conductive material. One end of the suction passage 33 is connected to the suction part 31. The other end of the suction passage 33 is extended to the outside of the rotation shaft 41 through the bearing 45 of the rotation shaft 41, and connected to the suction means 34. The heater 32 is provided to be electrically connected to the conductive surface of the suction passage 33 by a power supply line 32*a*. The conductive surface of the suction passage 33 serves also as a power supply path, and the suction passage 33 is connected to the external power supply unit 35 by the power supply line 32*b* through the bearing 45.

Figure 8:
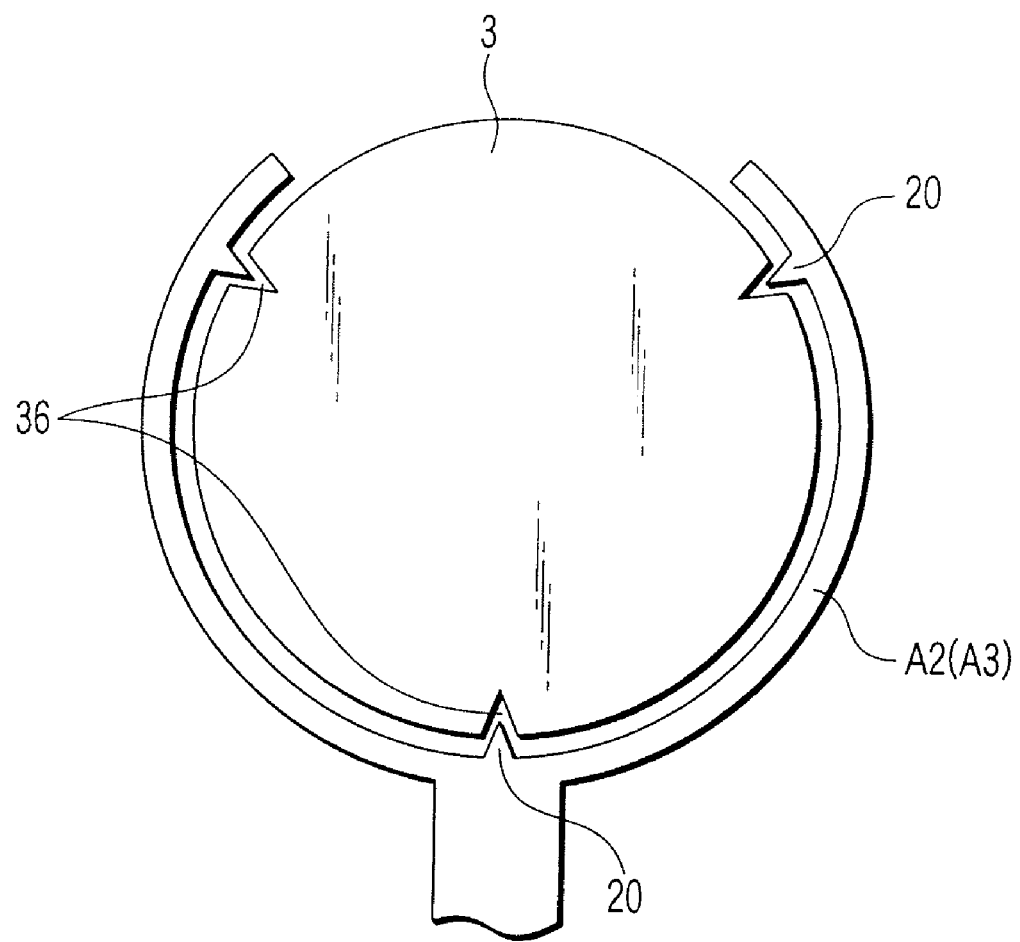
FIG. 8 is a an enlarged plan view of a substrate holder of a developing apparatus.
Figure 9:
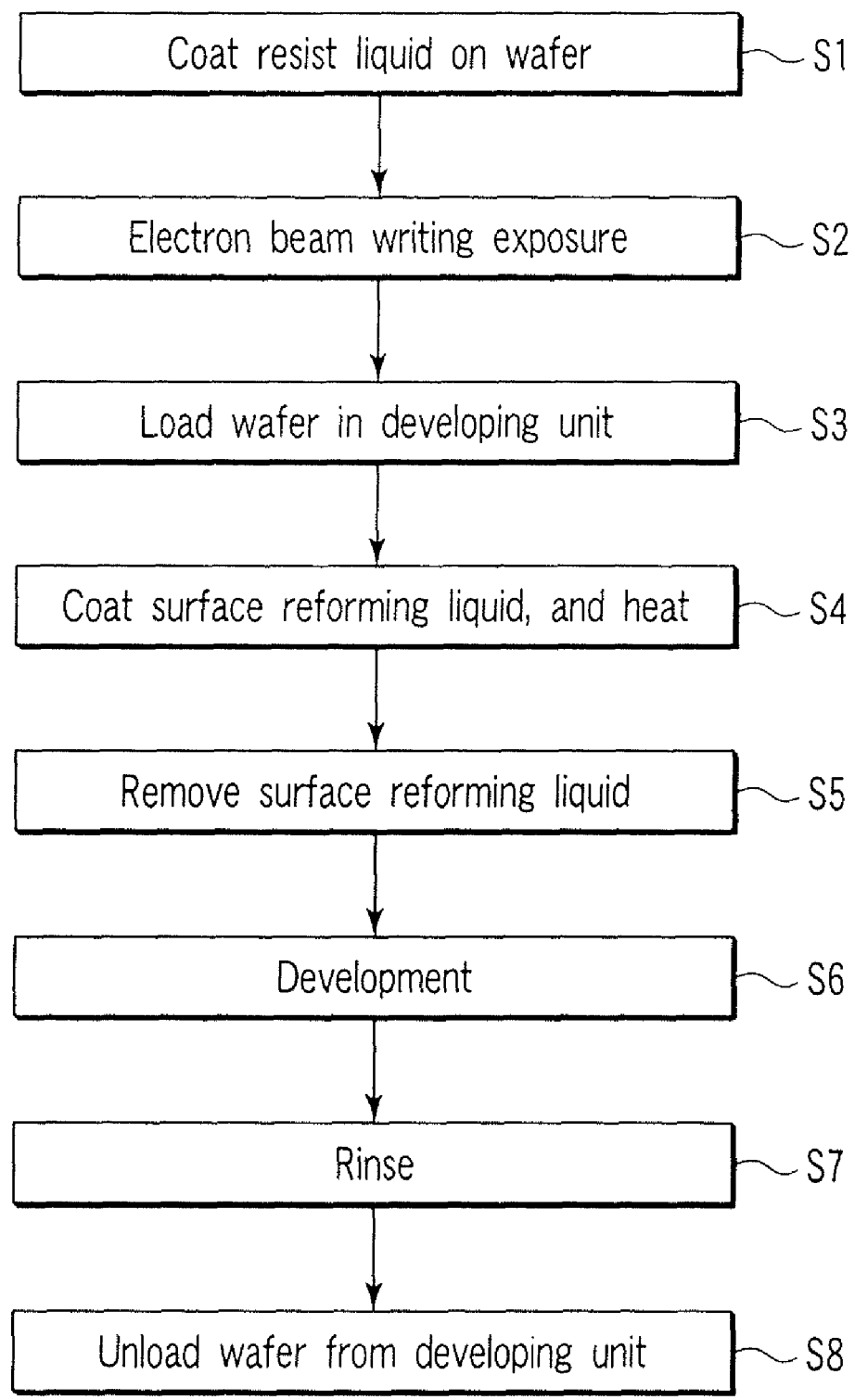
FIG. 9 is a flowchart showing a developing method according to a first embodiment of the invention.

The wafer W is held by the holding claws 20 of the main transfer mechanisms A2 and A3 at the peripheral edge portion on the backside, as shown in FIG. 8. At several portions of the periphery of the substrate holder 3 corresponding to the holding claws 20 of the main transfer mechanisms A2 and A3, a plurality of notch 36 is formed to pass the holding claws 20 of the main transfer mechanisms A2 and A2 in the vertical direction to accept the holding claws 20.

In the area around the spin chuck 3, the cup 5 is provided just like surrounding the side area from the wafer W to the spin chuck 3 when the wafer W is held by the spin chuck 3. The cup 5 consists of an outer cup 51 and an inner cup 52, which are movable up and down. The outer cup 51 is moved up by a up-and-down mechanism 50 connected to the lower end of the outer cup 51, and the inner cup 52 is moved up and down interlocking with the outer cup 51 in a part of the moving range of the outer cup 51. Namely, the outer cup 51 and inner cup 52 are moved up together, when the inner cup 52 is caught on a plurality of L-shaped portion 51*c* provided at regular intervals on the circumference of the lower end of the outer cup 51.

In the outer cup 51, the upper side 51*a* and lower side 51*b* are constructed as one body. The upper side 51*a* of the outer cup is shaped like a square cylinder, and the lower side 51*b* is shaped like a cylinder. In the inner cup 52, the upper side is inclined inward, and the opening of the upper side is formed narrower than the opening of the lower side. The opening of the upper side is positioned to surround the wafer W through a very small clearance to the outer periphery of the wafer when the inner cup 52 is in a descent position.

A circular plate 54 and a liquid sump 55 are provided under the spin chuck 3. The circular plate 54 is provided almost horizontal around the rotation shaft 41. The liquid sump 55 has a recess all around the circular plate 54. The bottom of the liquid sump 55 is connected with a drain line 53. In the area close to the periphery of the circular plate 54, a ring body 56 having a pyramid-shaped cross section is provided with its crest 56*a* close to the backside of the peripheral edge of the wafer W. A clearance 57 is formed between the outer circumference of the ring body 56 and the cup 5 (inner cup 52). Splash of liquid, such as a surface reforming liquid and a developing solution described later, flows to the liquid sump 55 through the clearance 57.

The circular plate 54 is provided with an up-and-down pin 58 used to transfer the wafer W between the spin chuck 3 and main transfer mechanisms A2/A3, and connected to a drain line 59 for naturally draining the liquid collide with the wafer W or ring body 56 and splashed to the circular disc 54. The up-and-down pin is supported by the up-and-down mechanism 58*a*, movably between a transfer position that the distal end is projected from the surface of the substrate holder 3, and a standby position that the distal end is placed inside the spin chuck 3.

Above the wafer W held by the spin chuck 3, a surface reforming liquid nozzle 61, a removing agent nozzle 62, a developing solution nozzle 63, and a rinse liquid nozzle 64 are provided. These four nozzles 61, 62, 63 and 64 are supported by nozzle moving mechanisms 11, 12, 13 and 14, movably in the X, Y and Z directions, as shown in FIG. 7.

The surface reforming liquid nozzle 61 is connected to the supply source 61*a* containing a surface reforming liquid (e.g. glycerin) for accelerating acid catalysis in a chemically amplified resist. The removing agent nozzle 62 is connected to the supply source 62*a* containing a removing agent (e.g. pure water) for removing a surface reforming liquid on a wafer. The developing solution nozzle 63 is connected to the supply source 63*a* containing a developing solution. The rinse liquid nozzle 64 is connected to the supply source 64*a* containing a rinse liquid (e.g. pure water) for removing a developing solution on a wafer.

These four nozzles 61-64 are designed to have substantially the same shape and size, and provided with a plurality of discharge port arranged in series in the lower part. These nozzles 61-64 are of a linear type having the length almost equal to the diameter of the wafer W. For example, the liquid supply area of the nozzles 61-64 is almost the same or longer than the width of the effective area of a substrate (the length almost equal to the diameter of the wafer W, in this example).

The nozzles 61-64 are slide by the nozzle moving mechanisms 11, 12, 13 and 14, along a guide rail 65 extending in the Y direction. The nozzle moving mechanisms 11, 12, 13 and 14 move up and down the nozzles 61-64 in the Z direction by. The controller 10 moves the nozzles 61-64 in the Y direction, and supplies a predetermined processing liquid to the whole surface of the wafer W, while making the nozzles 61-64 discharge a predetermined processing solution. The output section of the controller 10 is connected to the drive mechanism of the spin chuck 3 and the up-and-down mechanism of the outer cup 51. The controller 10 controls rotation and up/down movement of the spin chuck 3 and up/down movement of the cup 5, and operates the nozzles 61-64 according to the states of the spin chuck 3 and cup 5.

Next, an explanation will be given on a method of developing a resist-coated film on a wafer W by using a developing unit (DEV) with reference to FIG. 9-FIG. 11B.

Figure 10A:
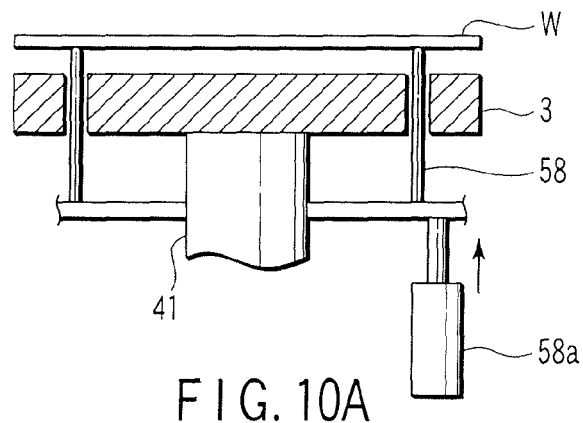
FIG. 10A is a schematic cross section showing a developing apparatus of a first embodiment, when transferring a wafer having a resist-coated film.

First, move the up-and-down pin 58 to a transfer position, transfer the wafer W from the not-shown main transfer mechanism A2 (A3) to the pin 58, and carry the wafer W into the developing unit 1 as shown in FIG. 10A (step S3). The wafer W has been coated with a chemically amplified resist liquid by the coating unit (COT) in the step S1, and written with a predetermined mask pattern by receiving a low-acceleration electron beam of about 5 kV for about 100 seconds in the electron beam exposure unit B4 in the step S2. The chemically amplified resist may be one of ESCAP resist (e.g. M20G; Product of Japan Synthetic Rubber (JSR), Acetal resist (e.g. UV135; Product of Shipley), or polymethyl methacrylate (PMMA).

Figure 10B:
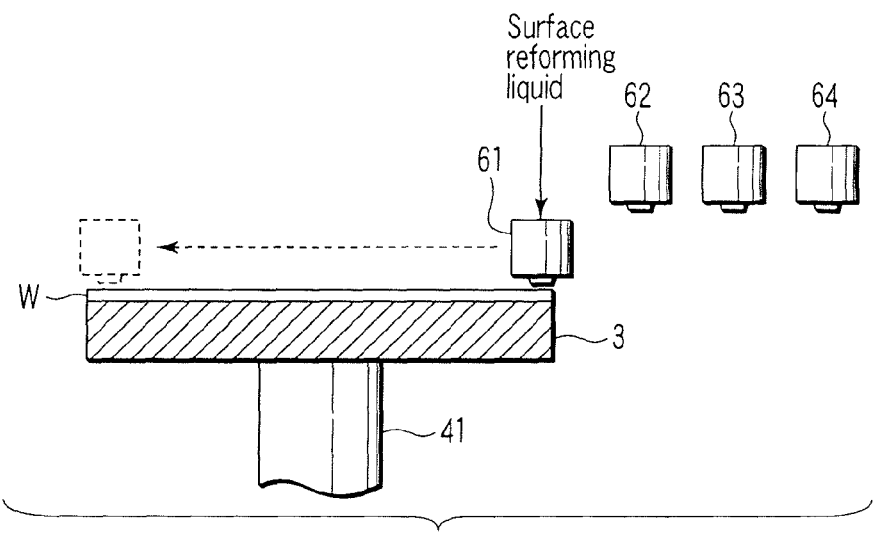
FIG. 10B is a schematic cross section showing a developing apparatus of a first embodiment, when heating a resist-coated film by PEB in a surface reforming liquid coated state.

Then, move the cup 5 up to a processing position, move the nozzle 61 close about 1 mm to the wafer W as shown in FIG. 10B, move the nozzle in the Y direction while discharging a surface reforming liquid (glycerin), and coat the whole surface of the wafer W with glycerin. Then, supply power to the heater 32 from the power supply unit 35 in the state that the wafer W is being coated with glycerin, and heat the wafer W to about 120° C. to cause a reaction of the chemically amplified resist film (step S4).

When there is a possibility that glycerin is condensed by heating, rotate the wafer W by the rotation mechanism 41-44 at a low speed of about 200 rpm not to condense glycerin only in the central area of the wafer W, and spread glycerin.

A temperature to cause acid catalysis in a chemically amplified resist film is about 100° C., and it is desirable to heat the wafer W higher, about 120° C. By heating at about 120° C. for about 1 minute in the state that the surface reforming liquid exists on the wafer surface, the activity of acid catalysis in the resist film is increased, a proton ($H^+$) is generated like a chain reaction, and the proton ($H^+$) is diffused in the resist film.

Figure 10C:
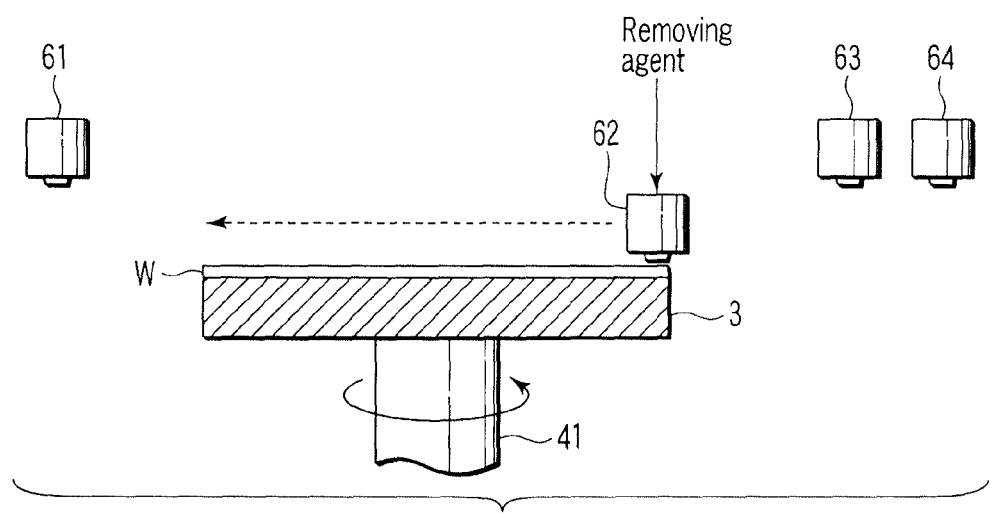
FIG. 10C is a schematic cross section showing a developing apparatus of a first embodiment, when stripping and removing a surface reforming film.

After the PEB process in the state that the wafer W is being coated with glycerin, stop supplying power to the heater 32, supply the removing agent to the wafer W as shown in FIG. 10C, and remove glycerin from the wafer W (step S5). Namely, place the removing agent nozzle 62 at a position close to the surface of one end of the wafer W so that the discharge port of the nozzle 62 is placed about 10 mm above the upper surface of the wafer W, move the nozzle 62 in the Y direction in the state that the wafer is being rotated at a speed of about 500 rpm while discharging the removing agent (pure water) from the nozzle 62, and supply the removing agent to the wafer W. Place the nozzle 61 to the other end side of the wafer W outside the outer cup 51.

After supplying the removing agent, rotate the wafer W at a high speed of about 4000 rpm to dissipate the glycerin and removing agent by the centrifugal force, and remove them from the wafer W. As a removing agent, pure water, or isopropyl alcohol (IPA) or ethanol-added pure water may be used. A removing agent is desirable to be adjusted to about 23° C. The wafer W may not be rotated when supplying the removing agent. Since the removing agent adjusted to a predetermined temperature is supplied to the wafer W and the wafer W is rotated to remove the glycerin and removing agent as described above, the wafer W heated to a high temperature by PEB is cooled to about 30° C. by cooling by the supply of the removing agent and by radiating heat by the rotation.

Figure 11A:
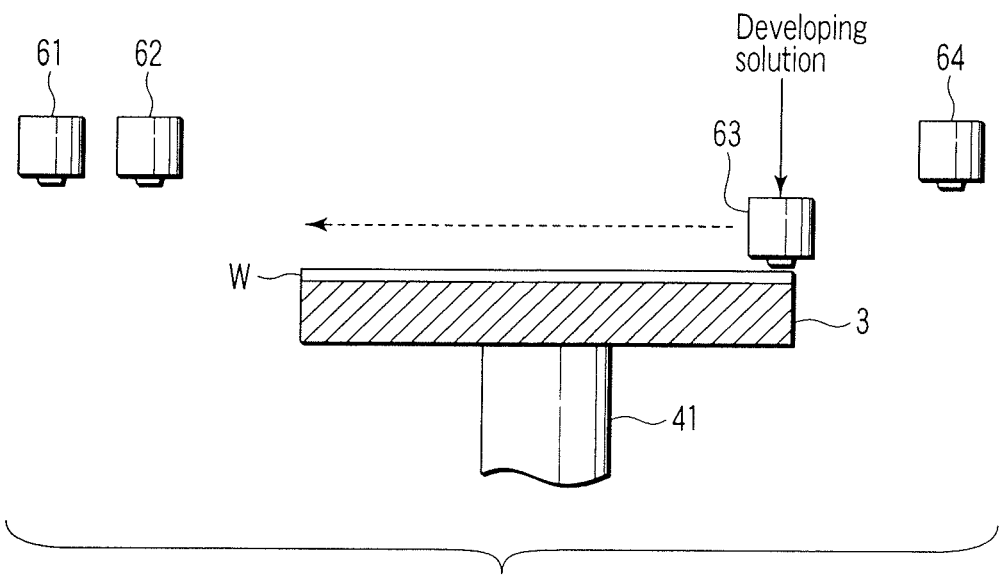
FIG. 11A is a schematic cross section showing a developing apparatus of a first embodiment, when developing a resist-coated film.
Figure 11B:
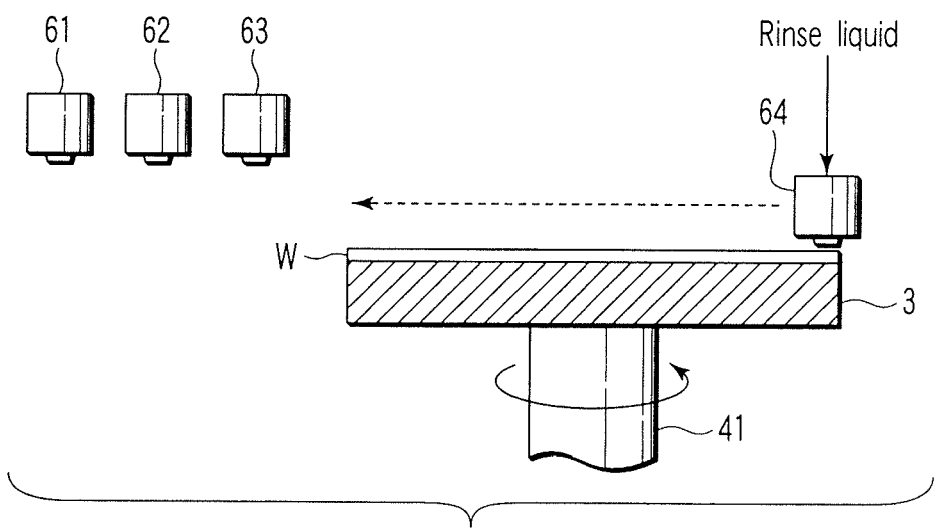
FIG. 11B is a schematic cross section showing a developing apparatus of a first embodiment, when rinsing a wafer.

After cooling the wafer W to a predetermined temperature, fill the developing solution on the wafer W as shown in FIG. 11A (step S6). Namely, move the developing solution nozzle 63 to a position close to the surface at one end side of the wafer W, so that the discharge port of the developing solution nozzle 63 is placed about 1 mm above the upper surface of the wafer W, move the nozzle 63 in the Y direction while discharging the developing solution, and fill the developing solution on the surface of the wafer. In this time, place the nozzles 61 and 62 to the other end side of the wafer W outside the outer cup 51.

After a predetermined time after filling the developing solution, supply pure water as a rinse liquid to the surface of the wafer W to wash away the developing solution (step S7). Then, rotate the wafer W at a high speed, remove the remained water from the wafer W by the centrifugal force, and finish the developing process. The rinse liquid is to be supplied by moving the rise liquid nozzle 64 from one end to the other end side of the wafer W while discharging the rinse liquid from the nozzle 64, in the state that the rinse liquid nozzle 64 is placed a position close to the surface at one end of the wafer W, so that the rinse liquid discharge port is placed about 1 mm above the surface of the wafer W, and the wafer W is rotated at a speed of about 500 rpm. The developing solution is washed away and removed by the rinse liquid supplied to the wafer surface as described above. Place the nozzles 61, 62 and 63 to the other end side of the wafer W outside the outer cup 51. After supplying the rinse liquid as described above, rotate the wafer W at a high speed of about 4000 rpm to dissipate and remove the rinse liquid by the centrifugal force.

After the heating (PEB) and developing processes for the resist film as described above, carry out the processed wafer W from the developing unit (DEV) 1 (step S8).

In the developing process, rotation of the substrate holder 3 of the developing unit (DEV), control of the power of the heater 32, on-off of the suction means, up-down of the up-and-down pin 58, up-down of the cup 5, driving of the nozzles 61-64, start/stop timing of supplying the surface reforming liquid, removing agent, developing solution and rinse liquid are controlled according to a program previously set by the controller.

Since the developing unit performs the heating (PEB) of an exposed resist film in the present invention as described above, it is unnecessary to provide a separate heating unit for PEB, and the number of processing units incorporated in the coating-developing apparatus can be reduced, and the footprint of the apparatus can be reduced.

A temperature of the wafer W in PEB is about 120° C. when a chemically amplified resist liquid is used, and about 140° C. when other kind of resist liquid is used, which is higher than 23° C. when developing the wafer W. However, since the removing agent previously adjusted to abut 23° C. is supplied to the surface of the wafer W and the wafer W is rotated to dissipate and remove the removing agent as described above, heat of the wafer W is momentarily lowered by cooling by the supply of removing agent and by radiating heat by the rotation. The wafer W is cooled to a temperature suitable for developing, and is smoothly developed.

The power supply path to the heater 32 uses the suction passage 33 made of a conductive material, and is connected to an external power supply unit through a bearing 35. Therefore, the power supply path to the heater 32 is not twined around the rotation shaft 41 when the spin chuck 3 is rotated, and the spin chuck 3 can be stably rotated. In this case, if the area of the suction part 31 close to the area contacting the wafer W is made of insulation material, the wafer W can be electrically shielded from the power supply path.

Further, since PEB is performed for the wafer W coated with a chemically amplified resist liquid by heating the wafer W in the state glycerin exists on the wafer surface as a surface reforming liquid, a resist can be reformed by sufficiently spreading acid in a resist film. As a result, as seen from the result of an embodiment described later, a well-shaped resist pattern with precise line width can be formed on the surface of a substrate in the developing process.

As for the reason why an activity of acid in a resist film can be accelerated by heating a resist in the state a surface reforming liquid exists on a resist film, the inventor considers as follows. When a resist is heated in the state that a surface reforming liquid contacts a resist film, the surface reforming liquid penetrates into a writing area of a resist film, the writing area becomes hydrophilic, and acid becomes easy to move in the writing area. Therefore, even a little amount of acid can be diffused in a writing area. By the acid diffused in the writing area, acid is generated like a chain reaction, and not only the surface of a resist film but also the lower side becomes acidic. Therefore, when development is performed, the sufficient acid in a resist film accelerates dissolution or non-dissolution by a developing solution, and a well-shaped resist pattern can be formed.

Since the penetration of surface reforming liquid is accelerated by heating the wafer W, a surface reforming liquid is required to exist on the surface of a resist film at the time of heating. As a proof of this, the inventor confirmed by experiments that a well-shaped pattern was not formed by PEB by heating the wafer W after applying glycerin as a surface reforming liquid to a resist film, supplying a removing agent to the wafer, and removing glycerin.

As explained above, according to this embodiment, even if energy given to a chemically amplified resist film in an exposing process is small, the insufficiency of energy can be supplemented by PEB, and as a result, a clear well-shaped resist pattern can be formed.

In the apparatus of this embodiment, even if the electron beam emitting time is reduced and the energy of electron beam given to a chemically amplified resist film is made small, a throughput can be increased, because insufficient exposure of resist can be made up in the PEB process in the present invention. Therefore, the invention is a very effective means for performing electron beam writing exposure.

Further, in the apparatus of this embodiment, the heater 32 is incorporated in the substrate holder 3 of a developing apparatus, and PEB is performed in the developing unit in the state that glycerin as a surface reforming liquid exists on a wafer having a chemically amplified resist film, for example. Therefore, even if the energy given to a resist film during exposure is insufficient, the inefficiency is supplemented, and acid catalysis in a chemically amplified resist liquid is accelerated and acid is generated like a chain reaction, and a well-shaped pattern can be obtained while preventing a decrease in a throughput.

Embodiment 2

Figure 12:
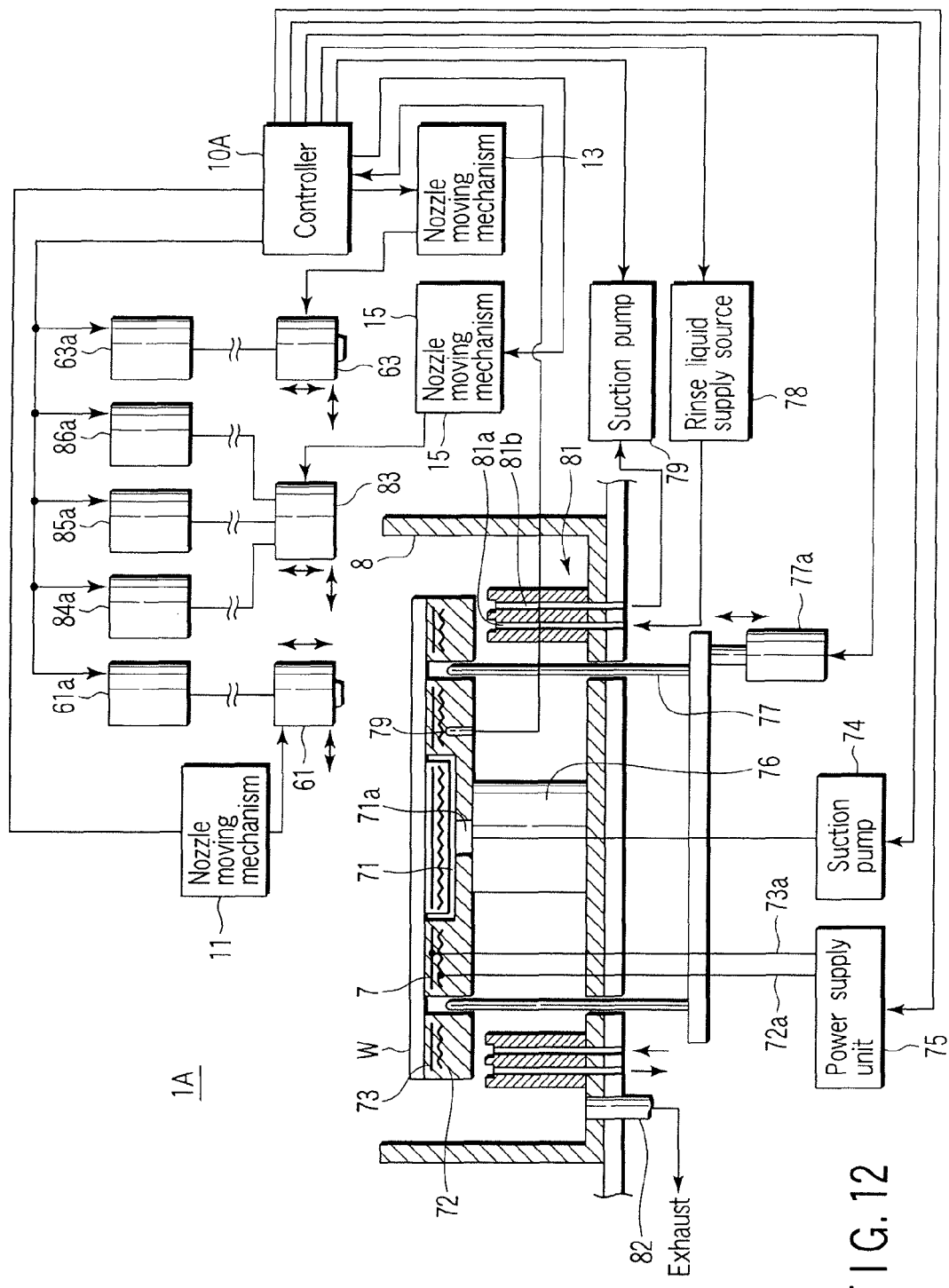
FIG. 12 is a sectional block diagram showing a developing apparatus according to a second embodiment of the invention.

An explanation will be given on a developing apparatus (a developing unit DEV) according to a second embodiment with reference to FIG. 12 and FIG. 13. Explanation on the parts of this embodiment overlapped with the first embodiment will be omitted.

In this embodiment, a substrate holder 7 contains a heater 72 and a cooler 73 (a cooling means), and is constructed not rotational. Namely, a mounting table 7 as a substrate holder contains a suction part 71, a heater 72, and a cooler 73 composed of a Peltier element, for example. The suction part 71, heater 72 and cooler 73 are connected to an external suction means 74 and a power supply unit 75, through a suction passage 71a and power supply paths 72a/73a.

A developing unit (DEV) 1A has a mounting table 7, a cup 8, three liquid supply nozzles 61, 63 and 83, five liquid supply sources 61a, 63a, 64a, 85a and 86a, nozzle moving mechanisms 11, 13 and 15, a heater 72, a cooler 73, a suction pump 74, a power supply unit 75, an up-and-down cylinder 77a, a temperature sensor 79, and a controller 10A. The developing unit (DEV) 1A is also provided with not-shown sensors and detectors in addition to the temperature sensor 79. These sensors are connected to the input section of the controller 10A, and send detected signals of temperature, flow rate, pressure, density, current, voltage, position, time, speed, and acceleration to the controller 10A. Based on these input signals, the controller 10A collectively controls the components of the developing unit (DEV) 1A.

A reference numeral 76 in the drawing denotes a support part to support the backside of the mounting table 7, and a reference numeral 77 denotes an up-and-down pin used to transfer the wafer W to the mounting table 7. The up-and-down pin 77 is supported movably up/down by an up-and-down cylinder 77a.

The cup 8 is provided just like surrounding the side and lower part of the mounting table 7. In the cup 8, a cleaning mechanism 81 for cleaning the peripheral edge area on the backside of the mounting table 7 is provided. The cleaning mechanism 81 has a rinse liquid supply passage 81a to supply a rinse liquid to the peripheral edge area on the backside of the mounting table 7, and a suction passage 81b to remove by absorbing the rinse liquid supplied through the rinse liquid supply passage 81a. At the bottom of the cup 8, an exhaust passage 82 is formed to exhaust the liquid remained in the cup 8 to the outside.

Above the mounting table 7, there are provided a surface reforming liquid nozzle 61 for supplying a surface reforming liquid to the upper surface of the wafer W held on the mounting table 7, a supply nozzle 83 which supplies and removes by absorbing the removing agent and rinse liquid to/from the upper surface of the wafer W, and a developing solution nozzle 63 for supplying a developing solution to the surface of the wafer W. These nozzles 61, 63 and 83 are moved in the 'Y direction and moved up and down in the Z direction by the nozzle moving mechanisms 11, 13 and 15, respectively.

Figure 13:
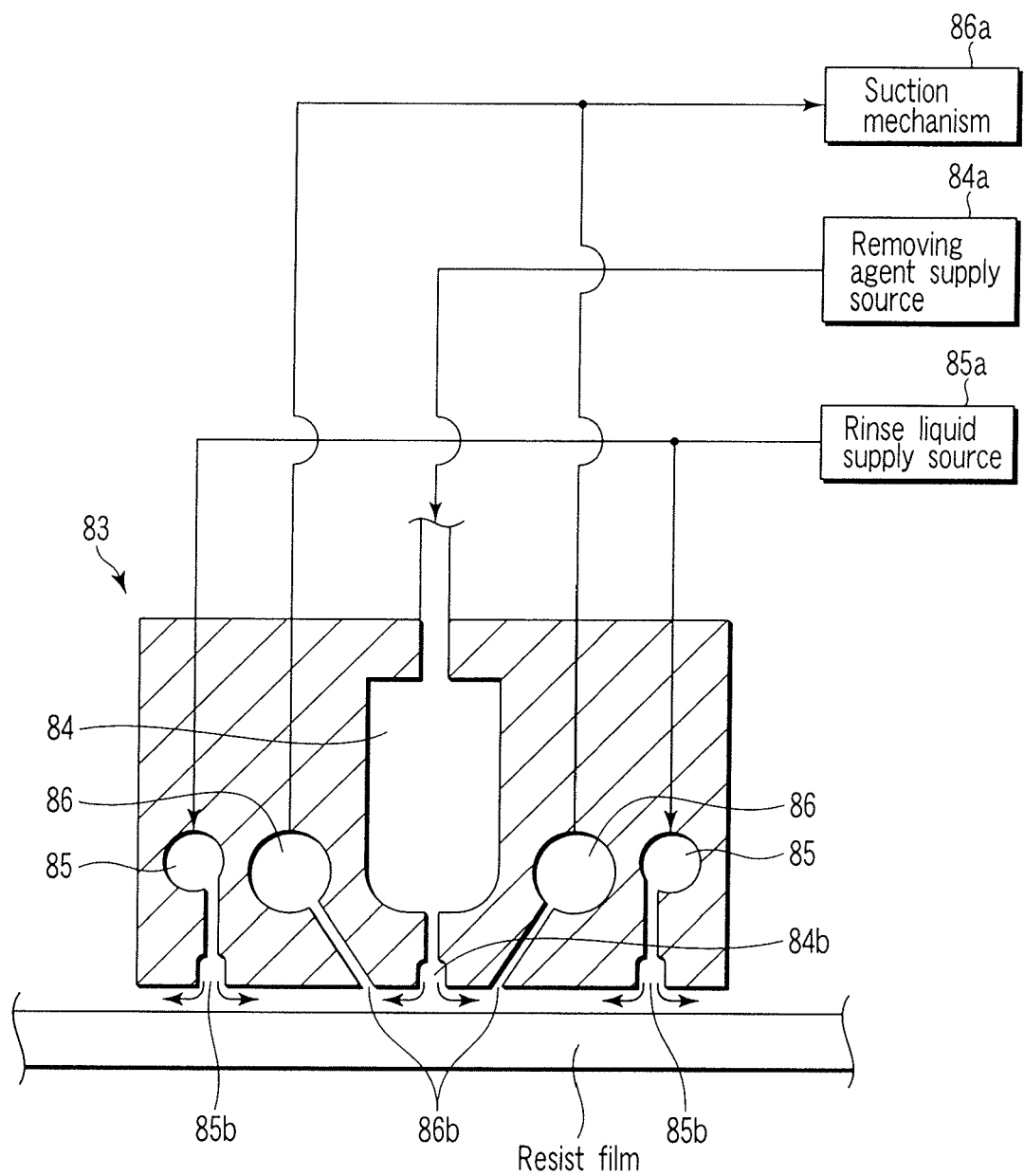
FIG. 13 is a longitudinal sectional view showing an example a supply nozzle provided in a developing apparatus.

As shown in FIG. 13, the supply nozzle 83 has the removing agent supply passage 84 for supplying the removing agent to the upper surface of the wafer W, a rinse liquid supply passage 85 for supplying a rinse liquid to the upper surface of the wafer W, and a suction passage 86 for removing by absorbing these liquid supplied to the upper surface of the wafer W from the upper surface of the wafer W. The removing agent supply passage 84, rinse liquid supply passage 85 and suction passage 86 are connected to a stripping liquid supply source 84a, a rinse liquid supply source 85a and a suction mechanism 86a, respectively. In this embodiment, a suction means is composed of the suction passage 86 of the supply nozzle 83 and the suction mechanism 86a. The surface reforming liquid nozzle 61 and developing solution nozzle 63 are the same as those in the aforementioned embodiment.

Figure 14:
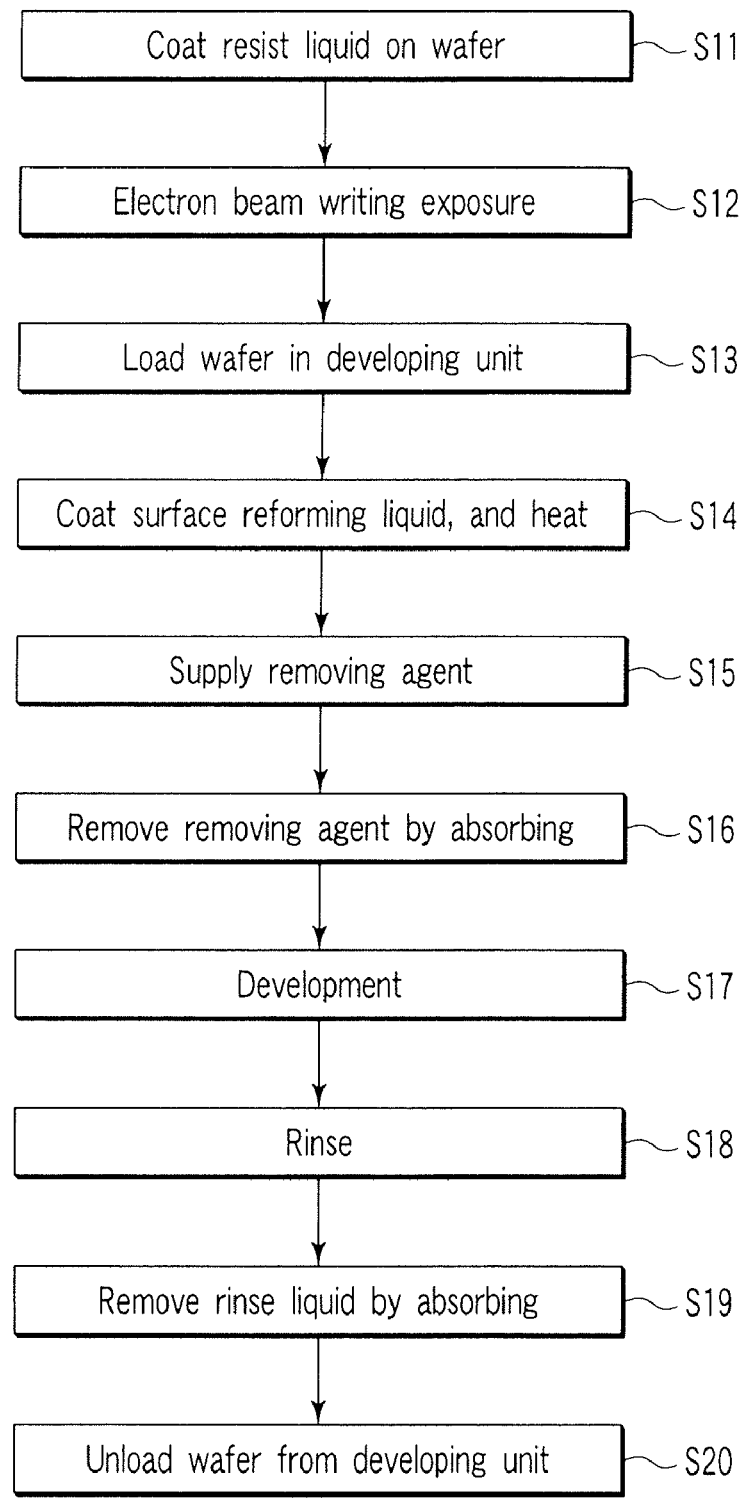
FIG. 14 is a flowchart showing a developing method according to a second embodiment of the invention.

Next, an explanation will be given on development of a resist-coated film on the wafer W by using the above-mentioned developing unit with reference to FIG. 14.

Apply a chemically amplified resist liquid to the wafer W by a coating unit (COT) (step S11), and write a predetermined pattern in a short time of about 100 seconds in the electron beam exposure unit B4 by using an electron beam with a low acceleration of about 5 kV, for example (step S12). Carry the wafer W into the developing unit 1A, and place the wafer on the mounting table 7 (step S13). Apply glycerin as a surface reforming liquid to the upper surface of the wafer W by the surface reforming liquid nozzle 61, supply a predetermined power to the heater 72 by the power supply unit 75, and heat the wafer W to a temperature of about 120° C. for performing PEB (step S14). While heating the wafer W, apply glycerin to the upper surface of the wafer W by moving the nozzle 61 from one end to the end side of the wafer W while discharging glycerin to the upper surface of the wafer W, in the state that the discharge port of the nozzle 61 is placed about 1 mm above the wafer surface.

Stop supplying power to the heater 72, and finish the PEB process. Supply power to the cooler 73 by the power supply unit 75, supply the removing agent adjusted to a predetermined temperature (e.g. 23° C.) to the upper surface of the wafer W by the nozzle 83, while cooling the wafer W to a temperature of 23-25° C., and remove by absorbing the removing agent by the suction mechanism 86a through the suction passage 86. Namely, discharge the removing agent to the upper surface of the wafer W, in the state that the discharge port 84b of the removing agent supply passage 84 and the suction port 86b of the suction passage 86 are placed above the wafer W to the height of 5 mm or less from the wafer surface (step S15). Move the nozzle 82 from one end to the other end side of the wafer W, while operating the suction mechanism 86a to absorb the removing agent existing on the upper surface of the wafer W through the suction passage 86, supply the removing agent to the upper surface of the wafer W, and remove by absorbing the supplied removing agent (step S16). Place the nozzle 61 to the other end side of the wafer W outside the cup 8.

The suction mechanism 86*a* removes glycerin from the upper surface of the wafer W together with the removing agent. Further in steps S15-S16, since the wafer W is cooled by the cooler 73, and the removing agent adjusted to 23° C. is supplied to the upper surface of the wafer W, the wafer W heated to a high temperature by PEB is quickly cooled to a temperature suitable for development, 23-25° C., for example.

Then, fill a developing solution on the upper surface of the wafer W by the developing solution nozzle 63, in the state that the wafer W is cooled by the cooler 73 to a temperature suitable for development, 23-25° C., for example. Place the nozzles 61 and 83 to the other end side of the wafer W outside the cup 8. Namely, in the state that the discharge port of the developing solution nozzle 63 is placed about 1 mm above the surface of the wafer W, while discharging a developing solution to the upper surface of the wafer W, move the developing solution nozzle 63 from one end to the other end side of the wafer W, fill the liquid on the upper surface of the wafer W, and develop the wafer (step S17).

A predetermined time after filling the developing solution, supply a rinse liquid to the upper surface of the wafer by the nozzle 83, wash away the developing solution, and finish development. Namely, first stop supplying power to the cooler 73, discharge the rinse liquid to the upper surface of the wafer W, in the state that the supply nozzle 83 is placed above the wafer so that the rinse liquid discharge port 85*b* and suction port 86*b* are placed at the height of 5 mm or lower from the surface of the wafer, and move the supply nozzle 83 from one end to the other end side of the wafer W while absorbing the rinse liquid on the upper surface of the wafer W through the suction passage 86 by operating the suction mechanism 86*a*. The rinse liquid is supplied to the upper surface of the wafer W, and the supplied rinse liquid is removed by absorbing through the suction passage 86 (step S18 and step S19). In this time, place the nozzle 61 to the other end side of the wafer W outside the cup 8, and place the nozzle 62 to one end side of the wafer W outside the cup. The developing solution on the upper surface of the wafer W is removed together with the rinse liquid. The developed wafer W is carry out by the developing solution unit (step 20).

In the above-mentioned development, rotation of the mounting table 7 of the developing apparatus (DEV), control of the power of the heater 72 and cooler 73, on-off of the suction means 74, up-down of the up-and-down pin 77, driving of the nozzles 61, 63 and 83, start/stop timing of supplying the surface reforming liquid, removing agent, developing solution and rinse liquid are controlled according to a program previously set by the controller.

Since PEB is performed in the developing unit (DEV) even in the above configuration, the footprint 7 of the apparatus can be made small, like in the case of performing PEB in the above-mentioned developing unit. Further, PEB is performed in the state that glycerin exists on the upper surface of the wafer W, and a well-shaped pattern can be formed when a chemically amplified resist liquid is used. The surface reforming liquid, removing agent, developing solution and rinse liquid supplied to the upper surface of the wafer W are removed by absorbing by a suction means, not by rotating the wafer W on the mounting table 7, and it is unnecessary to provide a rotation mechanism in the mounting table 7, and the configuration of the mounting table 7 becomes simple.

By incorporating the heater 72 and cooler 73 in the mounting table 7, the mounting table 7 heated to a high temperature by PEB can be quickly cooled to a temperature suitable for development. The cooler 73 incorporated in the mounting table 7 may be a type to cool the wafer W by blowing a cooling gas to the backside of the wafer W, for example. In this developing unit 1A, as in the developing unit 1 of the first embodiment, a nozzle may be prepared for each of surface reforming liquid, removing agent, developing solution and rinse liquid, and another nozzle may be prepared separately for suction.

In the above configuration, if the substrate holder is rotatable, coating of a surface reforming liquid may be done by spin coating, namely, supplying a surface reforming liquid to the area near the center of the wafer W, rotating the wafer W, and spreading the supplied surface reforming liquid. In this case, the liquid film thickness can be made thin, and the liquid film thickness can be made uniform. When supplying liquid such as a surface reforming liquid by using a nozzle having almost the same discharge area as the diameter of the wafer W, as in the above-mentioned configuration, the liquid film becomes a little thicker, but as the wafer W is not rotated, the surface reforming liquid is not spattered, and the liquid consumption amount is small.

In the invention, a resist liquid other than a chemically amplified resist liquid can be used. In this example, PEB is performed in the developing unit without supplying a surface reforming liquid to the wafer surface. In this case, also, as PEB and development are performed in the developing unit, the footprint of the apparatus can be reduced.

Further, in the invention, an exposure unit is not limited to an electron beam writing exposure unit which directly writes a pattern by an electron beam. An exposure unit which transfers a pattern through a photo mask by using a light source of g-ray, i-ray and excimer laser, an X-ray exposure unit, and an ion beam exposure unit may be used. Even if such exposure units other than an electron beam writing exposure unit are used, if energy given to a chemically amplified resist film on the upper surface of the wafer W is insufficient, the insufficiency of energy can be supplemented by heating the wafer W by PEB in the developing unit, in the state that a surface reforming liquid exists on the upper surface of the wafer W, and a throughput is not decreased even by exposing by low energy, and a well-shaped pattern can be formed.

Further, in the invention, a removing agent is supplied when cooling a substrate after PEB as in the above example. However, as in the case of cooling a substrate by rotation, a step of supplying the removing agent to a substrate may be performed simultaneously with a step of cooling a substrate by a cooling means. When a cooling means is provided in a substrate holder, a step of supplying a removing agent to a substrate may be performed separately from a step of cooling a substrate by a cooling means, for example, cooling a substrate after supplying the removing agent, and supplying the removing agent after cooling a substrate. Further, a cooling means may be incorporated in the substrate holder shown in FIG. 4, and a substrate may be cooled by combination of supplying the removing agent, rotating a substrate, and cooling by a cooling means.

The substrate holder of the invention may be a means for holding by absorbing the wafer W by utilizing an electrostatic absorbing force. When a removing agent and a rinse liquid are the same liquid, a common nozzle may be used to supply the removing agent and rinse liquid. The invention is also applicable to a developing apparatus, which develops not only a semiconductor wafer but also a glass substrate for a liquid crystal display (LCD substrate).

Explanations will now be given on the embodiment performed to confirm the effect of the invention, and a comparative example.

Embodiment 1

Figure 15:
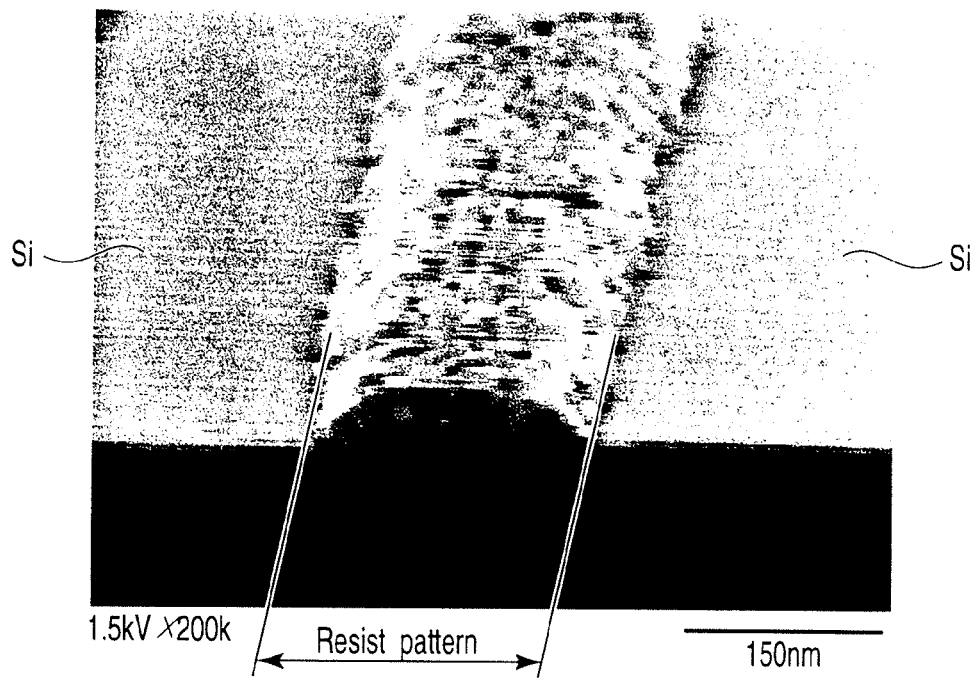
FIG. 15 is a scanning electron microscope (SEM) photograph showing the result of an embodiment executed to confirm the effect of the invention.

In the embodiment 1, a wafer is heated in the state that glycerin as a surface reforming liquid is coated on the surface of a wafer after exposure. The detailed test conditions are given below. After heating for a predetermined time by using the developing apparatus 1 shown in FIG. 6 in the state that glycerin is applied to the wafer W, wash away a surface reforming liquid by supplying pure water as a removing agent while rotating the wafer W, remove the removing agent on the wafer W by rotating the wafer at a high speed, and cool the wafer to 23° C. Fill a developing solution on the surface of the wafer W, supply pure water as a rinse liquid while rotating the wafer W, wash away the developing solution, and remove the rinse liquid on the wafer W by rotating the wafer W at a high speed, and form a pattern. FIG. 15 shows the photograph of the formed pattern taken by using a scanning electron microscope (SEM). The chemically amplified resist is M20G (JSR (Japan Synthetic Rubber) or UV135 (Shipley).

Resist: Positive ESCAP resist
Resist film thickness: 100 nm
Line width target value: 250 nm
Electron beam radiation amount: 6 mJ/cm$^2$
Electron beam radiation time: 90 sec.
PEB temperature and time: 90° C., 90 sec.
Removing agent supply time: 30 sec.
Removing agent supply speed: 500 rpm
Removing agent temperature: 23° C.
Removing agent removing speed and time: 4000 rpm, 15 sec.
Developing solution and developing time: TMAH=2.38 weight %, 60 sec.
Rinse liquid supply time: 15 sec.
Rinse liquid supplying speed: 500 rpm Rinse liquid removing speed and time: 4000 rpm, 15 sec.

Comparative Example 1

Figure 16:
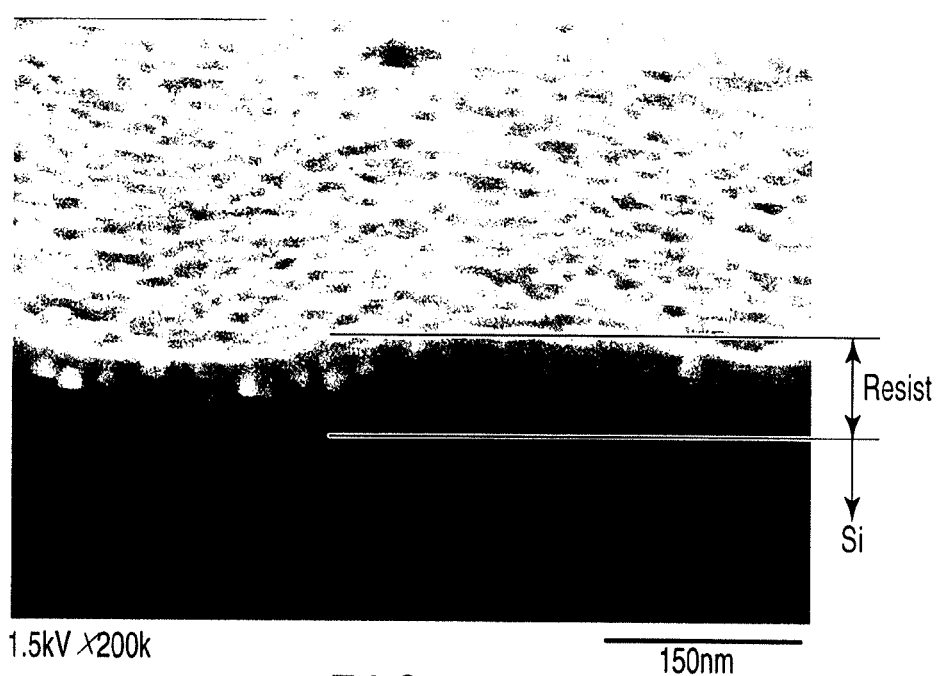
FIG. 16 is a scanning electron microscope (SEM) photograph showing the result of an embodiment executed to confirm the effect of the invention.

This example is performed in the same conditions as the embodiment 1 except that a surface reforming liquid is not used. FIG. 16 shows the photograph of the formed pattern taken by using a scanning electron microscope (SEM).

(Results and Considerations of Embodiment 1 and Comparative Example 1)

As seen from the results shown in FIG. 15 and FIG. 16, in the embodiment where the resist film is heated by putting glycerin as a surface reforming liquid on the film surface, the written area (electron beam applied area) dissolves in the developing solution, and the resist in the not-written area remains and forms a pattern. The line width of the pattern satisfies the target value. Contrarily, in the comparative example not using glycerin, the resist in the written area remains without dissolving, and a pattern is not formed at all. According to the above results, it is confirmed that when glycerin is used as a surface reforming liquid, acid catalysis can be accelerated in the PEB process even if an electron beam is set to a low acceleration.

The invention claimed is:

1. A developing method which develops a resist film on a substrate after exposure, characterized by comprising:
   (a) placing a substrate having an exposed chemically amplified resist film on a substrate holder;
   (b) supplying a surface reforming liquid to a substrate on the substrate holder for accelerating reaction of the chemically amplified resist, and heating a substrate to a predetermined temperature on the substrate holder for processing the resist film by PEB;
   (c) cooling a substrate on the substrate holder to a temperature capable of developing the resist film; and
   (d) developing the resist film by supplying a developing solution to a substrate on the substrate holder.

2. The method according to claim 1, wherein a removing agent is supplied to a substrate for removing a surface reforming liquid from a substrate, in the heating step (b) to the developing step process (d).

3. The method according to claim 1, wherein the resist film is a chemically amplified type, and
   the exposure is for writing a predetermined pattern by emitting an electron beam to the chemically amplified resist film.

* * * * *